United States Patent
Sonawane et al.

(10) Patent No.: US 10,317,463 B2
(45) Date of Patent: Jun. 11, 2019

(54) SCAN SYSTEM INTERFACE (SSI) MODULE

(71) Applicant: NVIDIA CORPORATION, Santa Clara, CA (US)

(72) Inventors: Milind Sonawane, San Jose, CA (US); Amit Sanghani, San Jose, CA (US); Jonathon E. Colburn, Ben Lomond, CA (US); Rajendra Kumar reddy.S, Bangalore (IN); Bala Tarun Nelapatla, Santa Clara, CA (US); Sailendra Chadalavda, Milpitas, CA (US); Shantanu Sarangi, Saratoga, CA (US)

(73) Assignee: NVIDIA CORPORATION, Santa Clara, CA (US)

( * ) Notice: Subject to any disclaimer, the term of this patent is extended or adjusted under 35 U.S.C. 154(b) by 0 days.

(21) Appl. No.: 15/336,747

(22) Filed: Oct. 27, 2016

(65) Prior Publication Data
US 2017/0115346 A1    Apr. 27, 2017

Related U.S. Application Data

(60) Provisional application No. 62/247,195, filed on Oct. 27, 2015, provisional application No. 62/285,429, filed on Oct. 27, 2015.

(51) Int. Cl.
| | |
|---|---|
| *G01R 31/3177* | (2006.01) |
| *G01R 31/317* | (2006.01) |
| *G01R 31/26* | (2014.01) |
| *G01R 31/28* | (2006.01) |
| *G01R 31/3185* | (2006.01) |
| *G06F 11/00* | (2006.01) |

(52) U.S. Cl.
CPC ...... *G01R 31/3177* (2013.01); *G01R 31/2607* (2013.01); *G01R 31/2803* (2013.01); *G01R 31/2806* (2013.01); *G01R 31/2834* (2013.01); *G01R 31/31701* (2013.01); *G01R 31/31707* (2013.01); *G01R 31/31724* (2013.01); *G01R 31/31725* (2013.01); *G01R 31/318555* (2013.01); *G01R 31/318572* (2013.01); *G06F 11/00* (2013.01)

(58) Field of Classification Search
CPC ............ G01R 31/3177; G01R 31/2607; G01R 31/2803; G01R 31/2806; G01R 31/2834; G01R 31/31701; G01R 31/31707; G01R 31/31724; G01R 31/31725; G01R 31/318555; G01R 31/318572; G06F 11/00

See application file for complete search history.

(56) References Cited

U.S. PATENT DOCUMENTS

| | | | | |
|---|---|---|---|---|
| 5,535,331 A | * | 7/1996 | Swoboda | G01B 31/31834 712/E9.016 |
| 5,656,963 A | | 8/1997 | Masleid et al. | |
| 5,805,608 A | * | 9/1998 | Baeg | G01R 31/2884 714/726 |

(Continued)

*Primary Examiner* — Kyle Vallecillo

(57) ABSTRACT

A method for testing. The method includes sending a single instruction over a JTAG interface to a JTAG controller to select a first internal test data register of a plurality of data registers. The method includes programming the first internal test data register using the JTAG interface to configure mode control access and state control access for a test controller implementing a sequential scan architecture to test a chip at a system level.

18 Claims, 9 Drawing Sheets

(56) References Cited

U.S. PATENT DOCUMENTS

| | | | |
|---|---|---|---|
| 5,812,562 A * | 9/1998 | Baeg | G01B 31/31855 714/726 |
| 5,970,241 A * | 10/1999 | Deao | G06F 11/3632 712/227 |
| 6,016,555 A * | 1/2000 | Deao | G06F 9/3005 712/E9.032 |
| 6,055,649 A * | 4/2000 | Deao | G06F 11/2236 714/30 |
| 6,065,106 A * | 5/2000 | Deao | G01R 31/31705 712/227 |
| 6,081,885 A * | 6/2000 | Deao | G06F 9/30072 712/220 |
| 6,106,568 A | 8/2000 | Beausang et al. | |
| 6,112,298 A * | 8/2000 | Deao | G06F 11/3648 712/227 |
| 6,192,092 B1 | 2/2001 | Dizon et al. | |
| 6,343,365 B1 | 1/2002 | Matsuzawa et al. | |
| 6,473,439 B1 | 10/2002 | Zerbe et al. | |
| 6,586,921 B1 * | 7/2003 | Sunter | G01R 31/31855 324/76.11 |
| 6,622,255 B1 | 9/2003 | Kurd et al. | |
| 6,724,328 B1 | 4/2004 | Lui et al. | |
| 6,763,485 B2 | 7/2004 | Whetsel | |
| 6,813,739 B1 * | 11/2004 | Grannis, III | G01R 31/2815 714/729 |
| 6,949,958 B2 | 9/2005 | Zerbe et al. | |
| 7,015,741 B2 | 3/2006 | Tschanz et al. | |
| 7,046,174 B1 | 5/2006 | Lui et al. | |
| 7,093,150 B1 | 8/2006 | Norman et al. | |
| 7,245,684 B2 | 7/2007 | Adkisson | |
| 7,288,973 B2 | 10/2007 | Zerbe et al. | |
| 7,409,612 B2 | 8/2008 | Van De Logt et al. | |
| 7,447,961 B2 | 11/2008 | Tan | |
| 7,509,549 B2 | 3/2009 | Larson et al. | |
| 7,613,967 B1 | 11/2009 | Tan | |
| 7,831,856 B1 | 11/2010 | Liu et al. | |
| 7,984,369 B2 | 7/2011 | Sul et al. | |
| 7,987,401 B2 | 7/2011 | Pandey | |
| 8,112,654 B2 | 2/2012 | Bjerregaard | |
| 8,205,182 B1 | 6/2012 | Zlatanovici et al. | |
| 8,438,437 B2 | 5/2013 | Jain et al. | |
| 8,694,844 B2 * | 4/2014 | Whetsel | G01R 31/31855 714/727 |
| 8,887,117 B1 | 11/2014 | Chuang | |
| 9,103,879 B2 | 8/2015 | Douskey et al. | |
| 9,116,205 B2 | 8/2015 | Douskey et al. | |
| 9,459,651 B2 | 10/2016 | Moheban et al. | |
| 9,529,044 B1 | 12/2016 | Taneja et al. | |
| 9,733,308 B2 * | 8/2017 | Whetsel | G01R 31/3177 |
| 2002/0162063 A1 | 10/2002 | Whetsel | |
| 2002/0196886 A1 | 12/2002 | Adkisson | |
| 2002/0199124 A1 | 12/2002 | Adkisson | |
| 2003/0053489 A1 | 3/2003 | Zerbe et al. | |
| 2003/0229834 A1 | 12/2003 | Cooke | |
| 2004/0190665 A1 | 9/2004 | Uratani et al. | |
| 2005/0055617 A1 | 3/2005 | Wang et al. | |
| 2005/0102643 A1 | 5/2005 | Hou et al. | |
| 2005/0234674 A1 | 10/2005 | Bundy et al. | |
| 2005/0242836 A1 * | 11/2005 | Goetting | G01R 31/3167 326/39 |
| 2005/0262492 A1 * | 11/2005 | Goetting | G01B 31/31853 717/151 |
| 2006/0022724 A1 | 2/2006 | Zerbe et al. | |
| 2006/0026473 A1 | 2/2006 | Patrick Tan | |
| 2006/0095818 A1 | 5/2006 | Bratt et al. | |
| 2006/0149987 A1 | 7/2006 | Klowden et al. | |
| 2007/0106923 A1 * | 5/2007 | Aitken | G11C 29/16 714/718 |
| 2008/0008015 A1 * | 1/2008 | Darbinyan | G11C 29/802 365/200 |
| 2008/0034334 A1 | 2/2008 | Laouamri et al. | |
| 2008/0046770 A1 | 2/2008 | Jong et al. | |
| 2008/0276116 A1 | 11/2008 | Bjerregaard | |
| 2009/0150709 A1 | 6/2009 | Arnold et al. | |
| 2009/0184735 A1 | 7/2009 | Wicki et al. | |
| 2010/0223519 A1 | 9/2010 | Swoboda | |
| 2010/0235698 A1 * | 9/2010 | Diewald | G01R 31/31855 714/731 |
| 2011/0099442 A1 | 4/2011 | Hales et al. | |
| 2011/0221469 A1 | 9/2011 | Schlagenhaft | |
| 2012/0117436 A1 | 5/2012 | Portolan et al. | |
| 2013/0159800 A1 | 6/2013 | Ravi et al. | |
| 2013/0194016 A1 | 8/2013 | Wimer | |
| 2014/0089750 A1 | 3/2014 | Douskey et al. | |
| 2014/0247080 A1 | 9/2014 | Moheban et al. | |
| 2014/0292385 A1 | 10/2014 | Bahl et al. | |
| 2014/0298125 A1 * | 10/2014 | Devadze | G06F 11/26 714/726 |
| 2015/0046763 A1 | 2/2015 | Makar et al. | |
| 2015/0178102 A1 | 6/2015 | Regner et al. | |
| 2015/0220470 A1 | 8/2015 | Chen et al. | |
| 2016/0070619 A1 * | 3/2016 | Moran | G01R 31/3185 714/15 |
| 2017/0115338 A1 | 4/2017 | Chadalavda et al. | |
| 2017/0115345 A1 | 4/2017 | Sonawane et al. | |
| 2017/0115351 A1 | 4/2017 | Datla Jagannadha et al. | |
| 2017/0115352 A1 | 4/2017 | Jayaraman et al. | |
| 2017/0115353 A1 | 4/2017 | Sonawane et al. | |
| 2017/0133070 A1 | 5/2017 | Ware et al. | |
| 2017/0205465 A1 | 7/2017 | Sarangi et al. | |
| 2017/0269145 A1 | 9/2017 | Whetsel | |
| 2018/0122444 A1 | 5/2018 | Ware et al. | |

* cited by examiner

SCAN SYSTEM INTERFACE (SSI) MODULE

RELATED APPLICATIONS

This application claims priority to and the benefit of following applications:

U.S. Provisional Application Ser. No. 62/247,195, filed on Oct. 27, 2015, entitled "SCANS SYSTEMS AND METHODS"; and U.S. Provisional Application Ser. No. 62/285,429, filed on Oct. 27, 2015, entitled "SCANS SYSTEMS AND METHODS";

which are all hereby incorporated by reference in their entirety for all intents and purposes.

BACKGROUND

Chips including semiconductor integrated circuits undergo a variety of tests to determine whether the semiconductor devices are operating properly. There are various stages of testing to screen defective and/or underperforming chips to avoid the cost of passing along a bad chip onto the next level of assembly. For example, the various stages of testing during each level of assembly include wafer level testing, package level testing, board level testing and system level testing. The quicker a bad chip is discovered, less wasted cost is incurred since it is removed from the assembly chain. That is, the amount of loss due to a bad chip at wafer level is lower than the amount of loss due to bad part at system level due to waste of material and efforts spent at subsequent stages of building a system and processes. So it is essential to screen the parts at each level.

In particular, scan based tests of the circuits may be performed to test one or more similarly configured chips. Scan based tests of circuits on a chip include "scan shift" and "scan capture" operations. These scan based tests can operate on a scan chain of connected registers (e.g., flip-flops or latches) that are designed for testing by inputting data and analyzing the output data from each of the scan chains.

During production level testing on ATE, automatic test pattern generator (ATPG) test patterns are typically run to screen the bad chips from good chips. ATPG test patterns are mainly run on automatic test equipment (ATE) during production testing at wafer level or/and package level to test chips in parallel.

It is desirable to run system level testing to perform routine maintenance, and perform failure testing. In a practical example, chips may be used in the infotainment system of automobiles. The need to run online system level tests of chips already integrated into the infotainment system at the system level (i.e., after the automobile is ready for consumer purchase) is mandatory in the industry. For instance, it is necessary to perform fault diagnosis and testing during the maintenance of the automobile system. On-line testing and diagnostics may follow industry standards, such as the functional safety standard for automobiles (e.g., ISO 26262) outlining functional safety features at each phase of product development for automobiles. On-line testing and diagnostics may be performed to determine failure in time (FIT) rates, reliability grading, and resiliency grading for mission critical applications. In addition, system level testing may be performed on a field return part, wherein a chip which passes production testing incurs a failure when implemented into a system. As such, it is necessary to support online testing and diagnostics in automobile applications for these specialized chips.

The biggest problem is that ATPG test patterns are difficult to implement at the system level, such as when performing online logic testing. System level testing heretofore included running scan debug tests, wherein all test scan chains are stitched into one single, long chain. The combined scan chain is driven from a test (e.g., TCK) clock. However, this scan debug test seems to be very slow because of the large number of flops in the chains that need to be loaded and unloaded. Also, ATPG test patterns cannot be directly applied in scan debug mode. Further, the additional infrastructure needed on a chip to support a scan debug mode is costly, and cannot be accommodated within the tight confines of the automobile cabin. As such, a scan debug mode is not feasible for performing system level testing.

Also, customers would like to run self-test patterns, such as logic built in self test (BIST) during power-on at the system level to made sure that the chip is still fully functional, before entering into mission mode. However, logic BIST test approaches are different depending on the chip and the electronic design automation (EDA) tool support. In most cases, the logic BIST does not provide higher test coverage because of the random patterns. As such, it is not suitable or economical to implement logic BIST for the purpose of running online system level testing.

SUMMARY

It is desirable to have system level testing of chips using ATPG test patterns. In embodiments of the present invention, a method for testing chips using a System Scan Interface (SSI) to enable online logic testing at system level is disclosed. The method includes sending a single instruction over a joint test action group (JTAG) interface to a JTAG controller to select a first internal test data register of a plurality of data registers. The method further includes programming the first internal test data register using the JTAG interface to configure mode control access and state control access for a test controller implementing a sequential scan architecture to test a chip at a system level.

In another embodiment, a computer system is described, wherein the computer system includes a processor, and memory coupled to the processor and having stored therein instructions that, if executed by the computer system, cause the computer system to execute a method for testing. The method includes sending an instruction to a JTAG controller to select a first internal test data register of a plurality of data registers. The method also includes programming the first internal test data register to configure mode control access and state control access for a test controller implementing a sequential scan architecture at a system level.

In still another embodiment, a non-transitory computer-readable medium having computer-executable instructions for causing a computer system to perform a method for testing is described. The method includes sending an instruction to a JTAG controller to select a first internal test data register of a plurality of data registers. The method also includes programming the first internal test data register to configure mode control access and state control access for a test controller implementing a sequential scan architecture at a system level.

These and other objects and advantages of the various embodiments of the present disclosure will be recognized by those of ordinary skill in the art after reading the following detailed description of the embodiments that are illustrated in the various drawing figures.

BRIEF DESCRIPTION OF THE DRAWINGS

The accompanying drawings, which are incorporated in and form a part of this specification and in which like numerals depict like elements, illustrate embodiments of the present disclosure and, together with the description, serve to explain the principles of the disclosure.

DETAILED DESCRIPTION OF THE INVENTION

Figure 1:
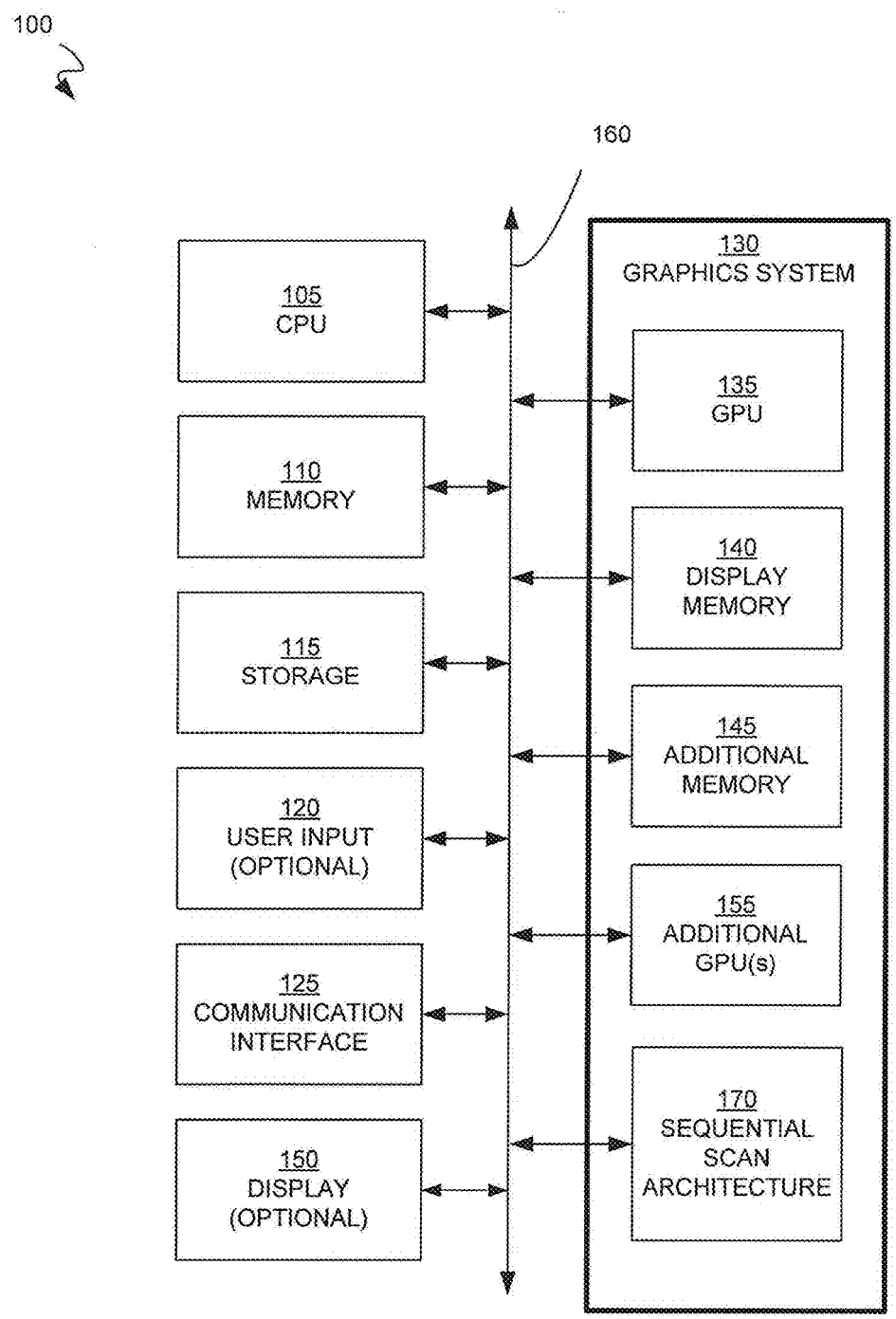
FIG. 1 depicts a block diagram of an exemplary computer system suitable for implementing embodiments according to the present disclosure.

Reference will now be made in detail to the various embodiments of the present disclosure, examples of which are illustrated in the accompanying drawings. While described in conjunction with these embodiments, it will be understood that they are not intended to limit the disclosure to these embodiments. On the contrary, the disclosure is intended to cover alternatives, modifications and equivalents, which may be included within the spirit and scope of the disclosure as defined by the appended claims. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

Accordingly, embodiments of the present invention provide for implementing a scan compression architecture for online logic testing at the system level. Further, embodiments of the present invention provide the above advantages and also provide for running ATPG test patterns designed for production level testing at the system level.

Throughout this application, the term "SoC" may be analogous to the term "chip," both defining an integrated circuit implemented on a single chip substrate. It may contain components of a computing system or other electronic system. In addition, the term "logic block" defines a specialized circuit design that performs one or more specific functions. The logic block may be integrated, in part, with other logic blocks to form an SoC. In addition, the term "logic block" may be analogous to the term "chiplet" or "design module."

Some portions of the detailed descriptions that follow are presented in terms of procedures, logic blocks, processing, and other symbolic representations of operations on data bits within a computer memory. These descriptions and representations are the means used by those skilled in the data processing arts to most effectively convey the substance of their work to others skilled in the art. In the present application, a procedure, logic block, process, or the like, is conceived to be a self-consistent sequence of steps or instructions leading to a desired result. The steps are those utilizing physical manipulations of physical quantities. Usually, although not necessarily, these quantities take the form of electrical or magnetic signals capable of being stored, transferred, combined, compared, and otherwise manipulated in a computer system. It has proven convenient at times, principally for reasons of common usage, to refer to these signals as transactions, bits, values, elements, symbols, characters, samples, pixels, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present disclosure, discussions utilizing terms such as "generating," "supplying," "configuring," "dividing," "scanning," or the like, refer to actions and processes (e.g., in flowchart 2 of the present Application) of a computer system or similar electronic computing device or processor (e.g., computer system 100 of FIG. 1). The computer system or similar electronic computing device manipulates and transforms data represented as physical (electronic) quantities within the computer system memories, registers or other such information storage, transmission or display devices.

Other embodiments described herein may be discussed in the general context of computer-executable instructions residing on some form of computer-readable storage medium, such as program modules, executed by one or more computers or other devices. By way of example, and not limitation, computer-readable storage media may comprise non-transitory computer storage media and communication media. Generally, program modules include routines, programs, objects, components, data structures, etc., that perform particular tasks or implement particular abstract data types. The functionality of the program modules may be combined or distributed as desired in various embodiments.

Computer storage media includes volatile and nonvolatile, removable and non-removable media implemented in any method or technology for storage of information such as computer-readable instructions, data structures, program modules or other data. Computer storage media includes, but is not limited to, random access memory (RAM), read only memory (ROM), electrically erasable programmable ROM (EEPROM), flash memory or other memory technology, compact disk ROM (CD-ROM), digital versatile disks (DVDs) or other optical storage, magnetic cassettes, magnetic tape, magnetic disk storage or other magnetic storage devices, or any other medium that can be used to store the desired information and that can accessed to retrieve that information.

Communication media can embody computer-executable instructions, data structures, and program modules, and includes any information delivery media. By way of example, and not limitation, communication media includes wired media such as a wired network or direct-wired connection, and wireless media such as acoustic, radio frequency (RF), infrared and other wireless media. Combinations of any of the above can also be included within the scope of computer-readable media.

FIG. 1 is a block diagram of an example of a computing system 100 capable of implementing embodiments of the present disclosure. Computing system 100 broadly represents any single or multi-processor computing device or system capable of executing computer-readable instructions. Examples of computing system 100 include, without limitation, workstations, laptops, client-side terminals, servers, distributed computing systems, handheld devices, gaming systems, gaming controllers, or any other computing system or device. In its most basic configuration, computing system 100 may include at least one processor 105 and a system memory 110.

It is appreciated that computer system 100 described herein illustrates an exemplary configuration of an operational platform upon which embodiments may be implemented to advantage. Nevertheless, other computer system with differing configurations can also be used in place of computer system 100 within the scope of the present invention. That is, computer system 100 can include elements other than those described in conjunction with FIG. 1. Moreover, embodiments may be practiced on any system which can be configured to enable it, not just computer systems like computer system 100. It is understood that embodiments can be practiced on many different types of computer systems 100. System 100 can be implemented as, for example, a desktop computer system or server computer system having a power general-purpose CPUs coupled to a dedicated graphics rendering GPU. In such an embodiment, components can be included that add peripheral buses, specialized audio/video components, I/O devices, and the like. Similarly, system 100 can be implemented as a handheld device (e.g., cell phone, etc.) or a set-top video game console device, such as, for example Xbox®, available from Microsoft corporation of Redmond, Wash., or the PlayStation3®, available from Sony Computer Entertainment Corporation of Tokyo, Japan, or the any of the SHIELD Portable devices (e.g., handheld gaming console, tablet computer, television set-top box, etc.) available from Nvidia Corp. System 100 can also be implemented as a "system on a chip", where the electronics (e.g., the components 105, 110, 115, 120, 125, 130, 150, and the like) of a computing device are wholly contained within a single integrated circuit die. Examples include a hand-held instrument with a display, a car navigation system, a portable entertainment system, and the like.

In the example of FIG. 1, the computer system 100 includes a central processing unit (CPU) 105 for running software applications and optionally an operating system. Memory 110 stores applications and data for use by the CPU 105. Storage 115 provides non-volatile storage for applications and data and may include fixed disk drives, removable disk drives, flash memory devices, and CD-ROM, DVD-ROM or other optical storage devices. The optional user input 120 includes devices that communicate user inputs from one or more users to the computer system 100 and may include keyboards, mice, joysticks, touch screens, and/or microphones.

The communication or network interface 125 allows the computer system 100 to communicate with other computer systems via an electronic communications network, including wired and/or wireless communication and including the internet. The optional display device 150 may be any device capable of displaying visual information in response to a signal from the computer system 100. The components of the computer system 100, including the CPU 105, memory 110, data storage 115, user input devices 120, communication interface 125, and the display device 150, may be coupled via one or more data buses 160.

In the embodiment of FIG. 1, a graphics system 130 may be coupled with the data bus 160 and the components of the computer system 100. The graphics system 130 may include a physical graphics processing unit (GPU) 135 and graphics memory. The GPU 135 generates pixel data for output images from rendering commands. The physical GPU 135 can be configured as multiple virtual GPUs that may be used in parallel (concurrently) by a number of applications executing in parallel.

Graphics memory may include a display memory 140 (e.g., a frame buffer) used for storing pixel data for each pixel of an output image. In another embodiment, the display memory 140 and/or additional memory 145 may be part of the memory 110 and may be shared with the CPU 105. Alternatively, the display memory 140 and/or additional memory 145 can be one or more separate memories provided for the exclusive use of the graphics system 130.

In another embodiment, graphics processing system 130 includes one or more additional physical GPUs 155, similar to the GPU 135. Each additional GPU 155 may be adapted to operate in parallel with the GPU 135. Each additional GPU 155 generates pixel data for output images from rendering commands. Each additional physical GPU 155 can be configured as multiple virtual GPUs that may be used in parallel (concurrently) by a number of applications executing in parallel. Each additional GPU 155 can operate in conjunction with the GPU 135 to simultaneously generate pixel data for different portions of an output image, or to simultaneously generate pixel data for different output images.

Each additional GPU 155 can be located on the same circuit board as the GPU 135, sharing a connection with the GPU 135 to the data bus 160, or each additional GPU 155 can be located on another circuit board separately coupled with the data bus 160. Each additional GPU 155 can also be integrated into the same module or chip package as the GPU 135. Each additional GPU 155 can have additional memory, similar to the display memory 140 and additional memory 145, or can share the memories 140 and 145 with the GPU 135.

Further, graphics system 130 may include sequential scan architecture 170 that is configured for using the system scan interface for enabling online testing of a SoC at the system level.

Figure 2:
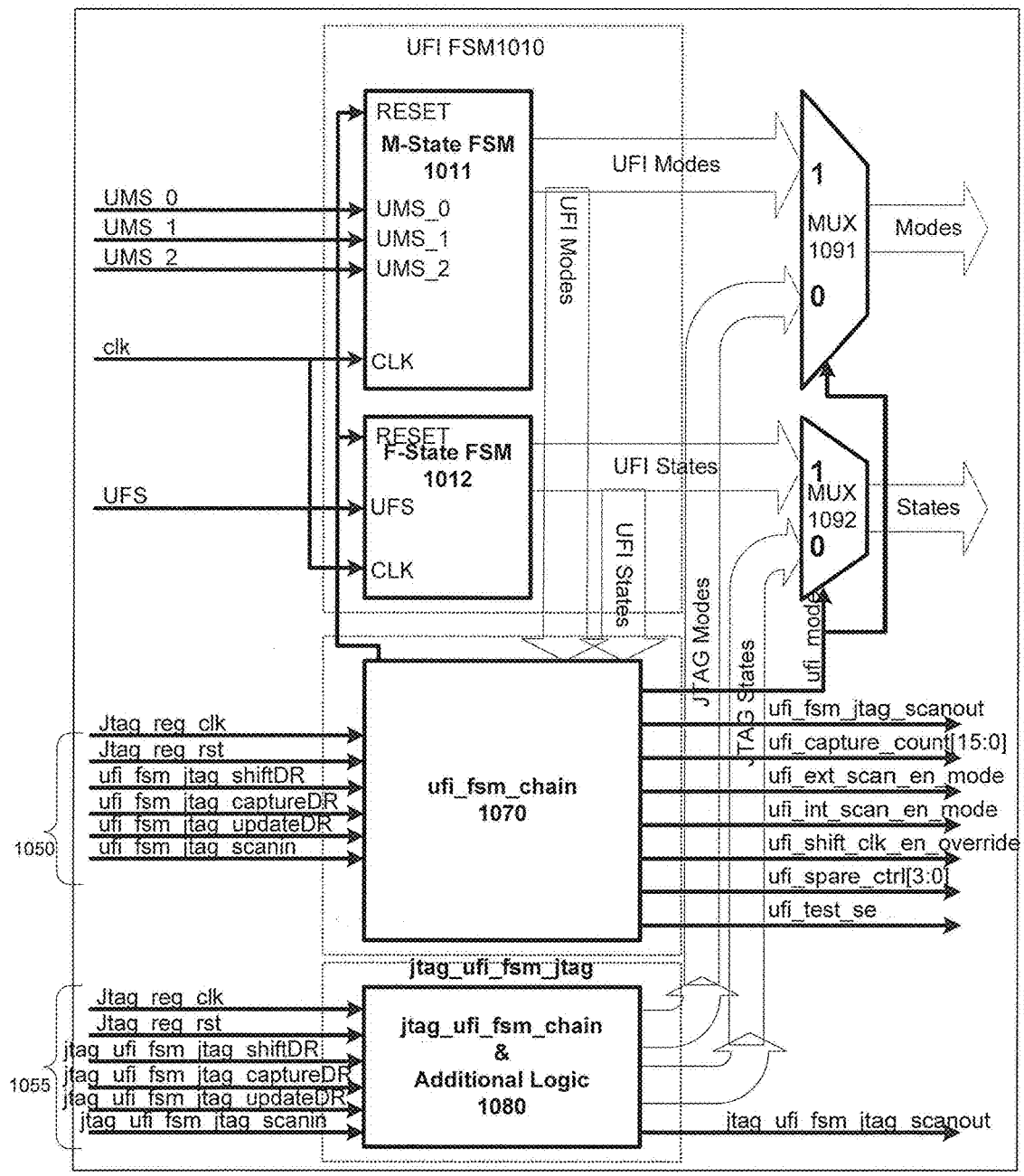
FIG. 2 is a block diagram illustrating a system scan interface in a ultra-fast-interface (UFI) module, in accordance with one embodiment of the present disclosure.

FIG. 2 is a block diagram illustrating a system scan interface in a ultra-fast-interface (UFI) module 200, in accordance with one embodiment of the present disclosure. In particular, the simplified diagram of the UFI module 200 is used to drive the centralized test controller 310 of FIG. 3, which performs the sequential scan compression in the sequential scan architecture used for testing a chip at system level. In particular, embodiments of the present invention provide for using SSI to enable online logic testing at the system level. For example, sequential scan compression is implemented to achieve testing under reduced pin counts and improved test pattern quality when performing testing of a chip.

As shown in FIG. 2, the UFI module 200 includes a UFI state machine 210, and SSI registers 220. The SSI registers 220 are used to reset, read, and write the controls signals required for the UFI module 200.

In particular, UFI module 200 can be implemented in two modes: (a) UFI mode for production testing using an ATE and, (b) SSI mode for system level testing. In particular, in the UFI mode, controls signals 250 are generated using an external UFI scan pin (not shown). On the other hand, in the SSI mode, control signals 260 are generated using JTAG/1500 interface (not shown), in one embodiment.

UFI module 200 includes a JTAG or 1500 test data register (TDR) to write/read UFI controls in JTAG mode. Table 1 shows control signals for the SYSTEM_UFI_FSM register 220.

TABLE 1

| FIELD | MNEMONIC | RESET | R/W | DESCRIPTION |
|---|---|---|---|---|
| 0 | jtag_ufi_mode0 | 0 | R/W | SSI Mode Select 0 |
| 0 | jtag_ufi_mode1 | 0 | R/W | SSI Mode Select 1 |
| 0 | jtag_ufi_mode2 | 0 | R/W | SSI Mode Select 2 |
| 0 | jtag_ufi_mode3 | 0 | R/W | SSI Mode Select 3 |
| 0 | jtag_ufi_ir_dr | 0 | R/W | SSI Mode or State |

Figure 3:
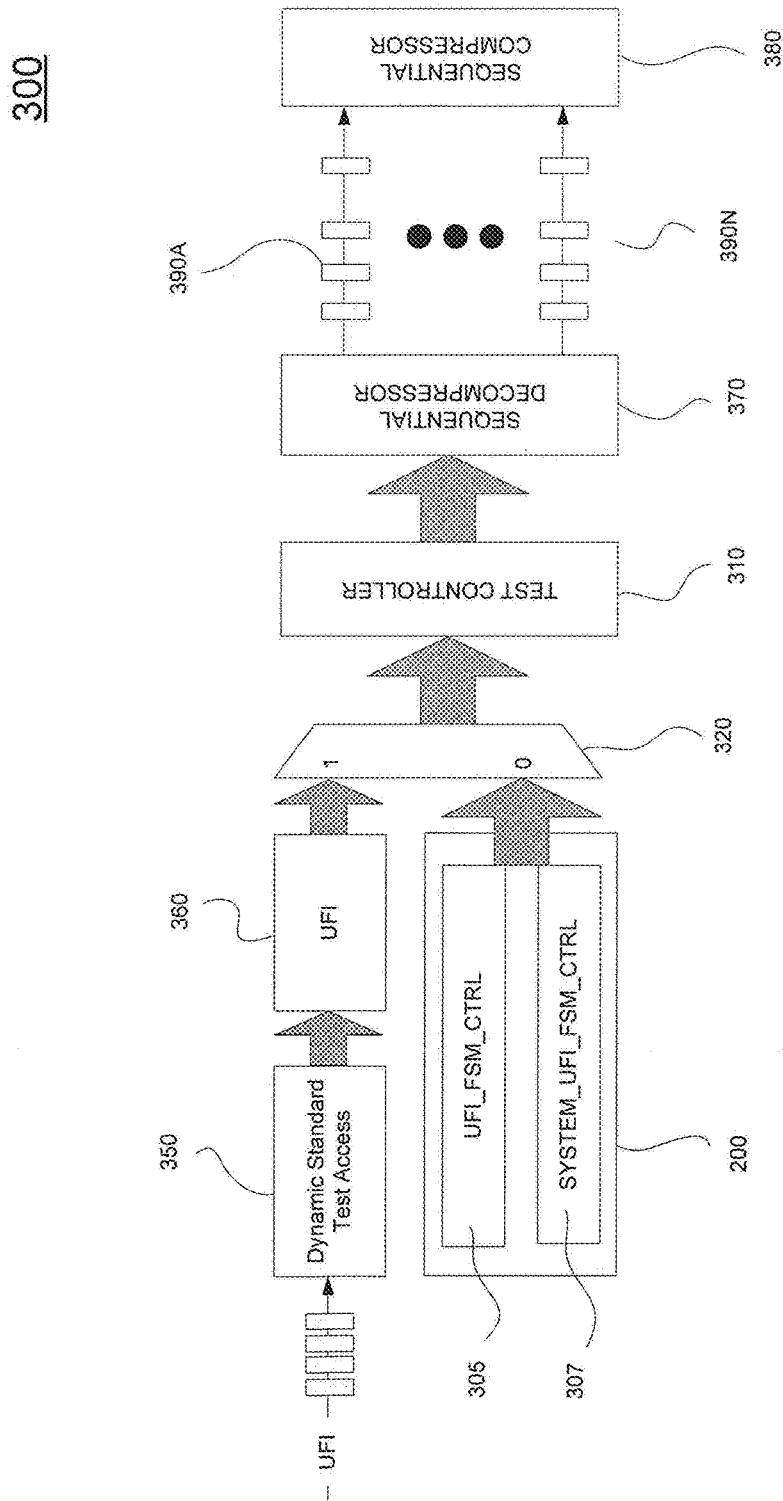
FIG. 3 is a block diagram illustrating the implementation of an SSI mode access for performing sequential scan compression, in accordance with one embodiment of the present disclosure.

FIG. 3 is a block diagram illustrating the implementation of SSI mode access for performing sequential scan compression in a sequential scan compression architecture 300, in accordance with one embodiment of the present disclosure. Sequential scan compression is mainly used for production testing of chips on ATE. However, in embodiments of the present invention sequential scan compression is used to translate ATPG test patterns, used during production testing, for use in an SSI mode of the sequential scan compression architecture 300. As such, the ATPG test patterns may be applied during system level testing of chips.

To run the sequential scan compression architecture 300 in SSI mode requires an implementation of SSI interface to control the centralized test controller 310 in JTAG mode. In IEEE 1500 IP based flow, various wrapper data registers are created to send control/read/write scan compression control signals. That is, the system scan interface is used to communicate control signals with the test controller 310 using the JTAG interface. The UFI module 200 is operating in a JTAG mode when the sequential scan compression architecture 300 is in SSI mode.

The SSI mode can be accessed during system level testing of a chip, wherein the SSI mode follows the IEEE 1500 IP based flow, in one embodiment. As such, IEEE 1500 wrapper data registers are created for controlling read and writes, and to send various mode and state control signals to the test controller 310. Those mode and state control signals are then communicated to sequential scan compression CODECs, such as sequential scan decompressor 370 and sequential scan compressor 380.

As previously introduced, the UFI module 200 is used to control the mode and state of the test controller 310. For example, when performing debug and bring-up of engineering samples during testing, there may be a need to read the mode and state values of the UFI module 200. This is achieved using the JTAG interface. During normal operation of sequential scan compression of the UFI module 200 operating in a JTAG mode for system level testing, the mode and state control signals need to be controlled using the IEEE 1500 cluster (not shown). In turn, the IEEE 1500 cluster is controlled using JTAG ports (not shown).

Further, the JTAG ports are used to dynamically access the various scan chains 390A-N involved in the sequential scan compression architecture 300. Previously, access of the scan chains involved using an "instruction register" to enable the specific chain that will be accessed. A "data register" is used to access (e.g., read or write) that specific scan chain. However, the use of the instruction register and data register involves too many cycles because a new instruction is needed for every access to a different data register. This detrimentally adds to the cycle overhead because there are many instructions written to one or more instruction registers for accessing a chip (e.g., during testing).

On the other hand, embodiments of the present invention are configured to control sequential scan compression logic using the JTAG ports. Specifically, input data can be delivered to the various scan chains using the JTAG ports. Also, response data can be observed using the JTAG ports. Further, configuring the sequential scan compression logic architecture for testing only involves a single instruction, as will be described further below.

In one embodiment, the multiple input shift register (MISR) is used for storing data (e.g., compressed test pattern) on the chip. In one implementation, during MISR unload, the MISR scan out is multiplexed (e.g., using MUX) with the Wrapper Scan Out (WSO) to TDO using an additional instruction.

Also, in the IP based flow while in ATE mode, the dynamic standard test access (DSTA) load and unload modules 350 are used to accommodate fewer than available pins at the chip level for a specific SoC. In production testing or ATE mode, test controller 310 control inputs are driven from the UFI module 360. In particular, the aforementioned UFI_FSM 1500 Wrapper data registers 305 are reset using WRSTN in the ATE mode, and default programmed values will bring those registers into the production testing mode. Also, the UFI_FSM_CTRL register 305 is used to read mode/state control signals that are driven by the UFI module 360 in the ATE mode. The UFI_FSM_CTRL register 305 may be programmed during test-setup.

On the other hand, switching to online system level testing is achieved using the JTAG ports. In particular, the UFI_FSM 1500 Wrapper data registers 305, used for ATE mode, need to be programmed to enable online system level logic testing (e.g., enabling ufi_mode to 0), which also disables the production level ATE test mode. In SSI mode, the multiplexor 320 is configured to select the proper MUX input, which will drive the test controller 310 using control inputs obtained from the SYSTEM_UFI_FSM test data register 307. In particular, during SSI mode, the test controller 310 control inputs 260 are driven from a IEEE 1500 SYSTEM_UFI_FSM WDRs. In this manner, mode and state control inputs are used drive the test controller 310. These data registers (e.g., UFI_FSM 1500 Wrapper data registers 305 and SYSTEM_UFI_FSM test data register 307) are located in the same partition where the UFI module 200 and the centralized test controller 310 are integrated, in one embodiment. Table 2 lists the various DSTA modes.

TABLE 2

| DSTA MODE | DSTA PINS | COMMENTS |
|---|---|---|
| 4X | 6 | Basic DSTA Mode |
| 6X | 4 | Flexible DSTA Mode |
| 8X | 3 | Flexible DSTA Mode |
| 12X | 2 | Flexible DSTA Mode |
| 24X | 1 | Single Pin Mode for SSI |

Figure 5:
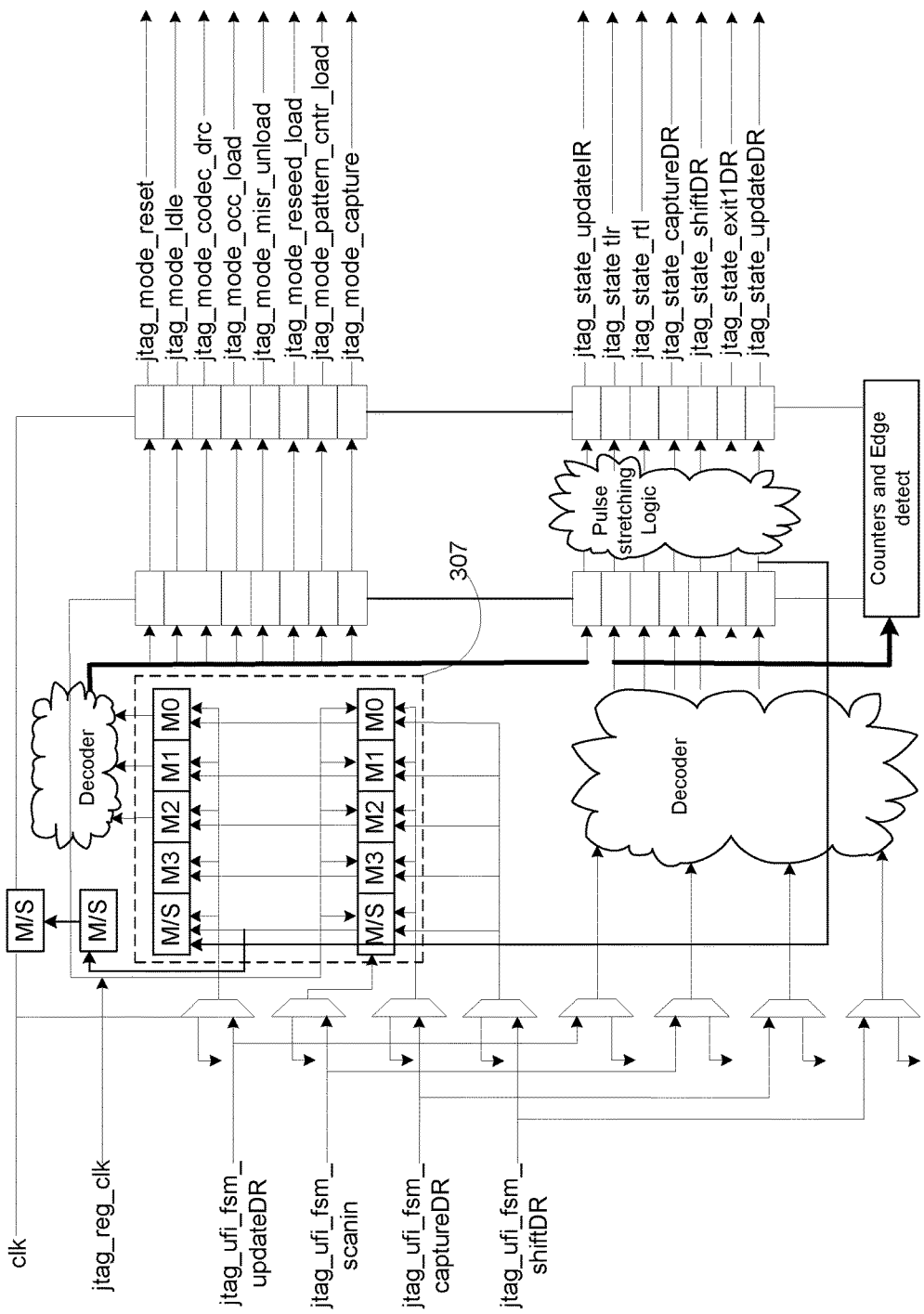
FIG. 5 is a block diagram illustrating the use of a SYSTEM_UFI_FSM_CTRL register when performing system level testing of a chip using a system scan interface, in accordance with one embodiment of the present disclosure.

FIG. 5 is a block diagram illustrating the use of a SYSTEM_UFI_FSM_CTRL register 307 in the sequential scan architecture 300 of FIG. 3 when performing system level testing of a chip using a system scan interface, in accordance with one embodiment of the present disclosure.

In particular, the sequential scan architecture 300 uses the centralized test controller 310 and codecs (e.g., PRPG as sequential decompressor 370, and MISR as sequential compressor 380) for implementing SSI mode. As previously described, the test controller 310 is controlled from a set of mode signals and state control signals. The SYSTEM_UFI_FSM_CTRL register 307 is selected during test setup using a single instruction. The patterns stored in the SYSTEM_UFI_FSM_CTRL register 307 are used to derive mode and state control signals.

In particular, putting the SYSTEM_UFI_FSM_CTRL register 307 into the TDR mode used for system level testing only requires a single instruction. In that manner, the system_ufi_ir_dr bit is set to 1. This allows for single Instruction access to the SYSTEM_UFI_FSM_CTRL register 307 at the beginning, and throughout implementation of system level testing. Mode and state control will be implemented by using the SYSTEM_UFI_FSM_CTRL register 307, a register in the plurality of test data registers, depending on the data written into that register 307.

In one embodiment, while the SYSTEM_UFI_FSM_CTRL register 307 is in TDR mode, it will be used in ping-pong fashion to control modes and states alternately. In the ping-pong implementation, in one cycle the SYSTEM_UFI_FSM_CTRL register 307 is used for mode control, and in the next cycle the SYSTEM_UFI_FSM_CTRL register 307 is used for state control. These cycles are repeated.

For example, upon "Reset" (e.g., after a STATE_WRITE phase, or upon initiation of the register 307 for testing), the SYSTEM_UFI_FSM_CTRL register 307 acts as a mode register. In the next access, the SYSTEM_UFI_FSM_CTRL register 307 is used for state control. In the ping-pong fashion, the SYSTEM_UFI_FSM_CTRL register 307 alternates between mode access and state access repeatedly (e.g., mode access, state access, mode access, state access, etc.).

Specifically, mode control signals are decoded based on mode values written during the MODE_WRITE phase to the SYSTEM_UFI_FSM_CTRL register 307. In this phase, the "jtag_ufi_ir_dr" is set to "1". The "jtag_ufi_ir_dr" bit will not allow writes to this register when set to "0", such as when the SYSTEM_UFI_FSM_CTRL register 307 is operating in a state control phase (e.g., STATE_WRITE phase). In this case, the existing mode bits will be the same as when written in the previous MODE_WRITE. During the STATE_ WRITE phase of operation for the SYSTEM_UFI_FSM_ CTRL register 307, the state control signals (e.g., captureDR, shiftDR, updateDR signals) will be used to derived JTAG states during the STATE_WRITE phase.

The ping-pong access of the SYSTEM_UFI_FSM_CTRL test data register 307 will allow the SYSTEM_UFI_FSM_CTRL register 307 to be used for mode control and state control without accessing any other instruction register. That is, based on the values and configuration stored in SYSTEM_UFI_FSM_CTRL register 307 will determine whether the control signals are used for mode control or state control to drive the test controller 310.

Table 3 shows details of the SYSTEM_UFI_FSM_CTRL register 307. In particular, when the SYSTEM_UFI_FSM_CTRL register 307 is selected, the test data input (TDI) pin will be connected to various scan chain inputs. In addition, test data output (TDO) will be connected to the scan chain outputs, depending on the mode control signals.

TABLE 3

| PORT | TYPE | DESCRIPTION |
| --- | --- | --- |
| WSI | input | Wrapper Serial Input |
| WSO | output | Wrapper Serial Output |
| WRCK | input | Wrapper Input Clock |
| WRSTN | input | Wrapper Reset |
| captureWR | input | Wrapper captureDR |
| shiftWR | input | Wrapper shiftDR |
| updateWR | input | Wrapper update DR |
| jtag_ufi_ir_dr | Output | SSI IR or DR selection |
| jtag_ufi_mode3 | Output | SSI UFI mode bit 3 |
| jtag_ufi_mode2 | Output | SSI UFI mode bit 2 |
| jtag_ufi_mode1 | Output | SSI UFI mode bit 1 |
| jtag_ufi_mode0 | Output | SSI UFI mode bit 0 |

FIG. 5 is a block diagram illustrating the use of a SYSTEM_UFI_FSM_CTRL register 307 when performing system level testing of a chip using a system scan interface, in accordance with one embodiment of the present disclosure. A sequence of operations and use of the SYSTEM_UFI_FSM_CTRL register 307 for both mode control and state control in the sequential scan architecture 300 of FIG. 3 is described below in relation to FIG. 5.

During JTAG reset, the SYSTEM_UFI_FSM_CTRL register 307 is initialized to 5'b00000, in one embodiment. For example, register 307 is initialized at the beginning of system level testing, and after each STATE_WRITE phase.

During mode control access, when the MSB of the SYSTEM_UFI_FSM_CTRL register 307 is programmed to "0", this allows access to register 307. In particular, use will write the MSB of register 307 to 1'b1, assuming that the next access will be state control access (e.g., ping-pong fashion). In one implementation, when the MSB of SYSTEM_UFI_FSM_CTRL register 307 is programmed to "1," and mode2, mode 1, and mode0 are programmed to intended mode controls, this combination of mode bits will give the corresponding mode control test (e.g., selected between 8 mode tests based on a 3 bit value) and an associated update IR. In one implementation, mode3 is reserved for a later purpose (e.g., increasing the number of mode control tests).

In earlier mode control access, the MSB of the SYSTEM_UFI_FSM_CTRL register 307 is programmed to 1'b1. This allows state control signals to be used to derive TLR, RTI, CaptureDR, ShiftDR, exit1DR, UpdateDR, during state control access. This sequence is used by sequential scan compression test controller 310 of FIG. 3 to access sequential scan compression chains dynamically. These various chains will be considered as shift registers during this access. For example, during state control access, "itag_ufi_fsm_scanin" and "itaa_ufi_fsm_canout" are available to send "scanin" data to sequential decompression codec 370 from TDI, and observed misr unload data is outputted from the sequential compression codec 380 to TDO.

At the end of the test sequence of the sequential scan compression procedure during the state control access, "call update DR" will reset the MSB of the SYSTEM_UFI_FSM_CTRL register 307, so that register 307 is again ready for mode access.

In one embodiment, during SYSTEM_UFI mode or SSI mode to implement system level testing, the Dynamic Standard Test Access (SERDES) will be configured in 24× mode. As such, wait cycles are added during RTI to make sure the mode and state control signals transferred over a JTAG interface over a relatively fast JTAG clock domain are correctly transferred to the slower clock domain (e.g., 1f clock) used within the sequential scan architecture 300.

Figure 6:
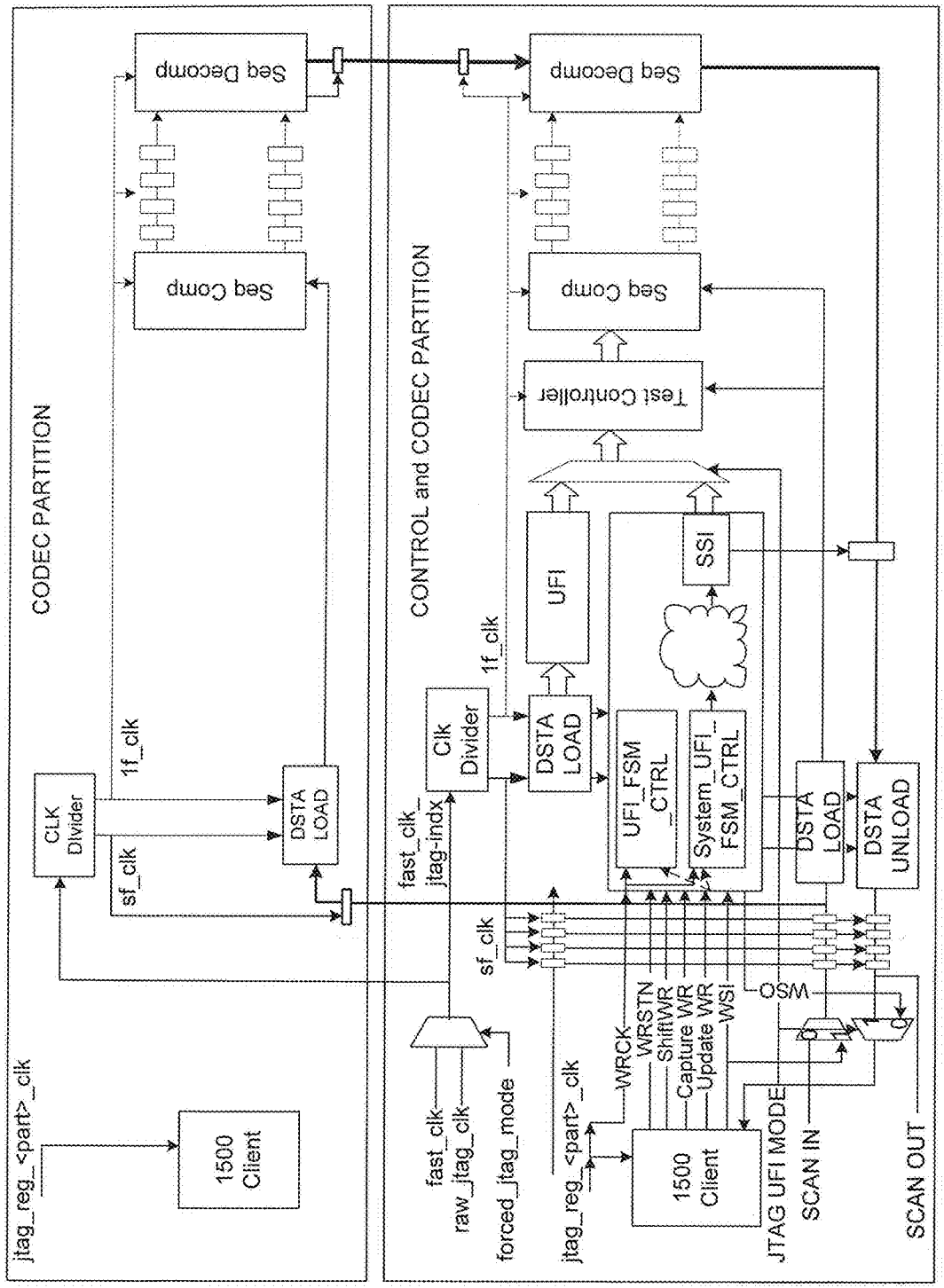
FIG. 6 is a block diagram illustrating the clocking used for a system scan interface in a sequential scan architecture, in accordance with one embodiment of the present disclosure.

FIG. 6 is a block diagram illustrating the clocking used for a system scan interface in a sequential scan architecture 600, in accordance with one embodiment of the present disclosure. For SSI mode is it required to prepare the testing procedures (e.g., xtr procedures including sequential scan compression) according SYSTEM_UFI_FSM_CTRL register access. In particular, SSI mode is enabled in the sequential scan architecture 600 when UFI_MODE="0". This is accomplished by disabling production of the UFI mode, and enabling the JTAG mode, as previously described.

As shown in FIG. 6, the clocking for JTAG mode will be from TCK (fast clock). For example, input data is clocked using TCK. A clock divider is configured to divide TCK to generate a slow clock which is used to drive the test controller, sequential codecs, and DSTA load/unload modules. Further, the capture clocks will be from "occ." As such, the scan chain access during sequential scan compression is accomplished using the SSI interface and JTAG ports.

Figure 7A:
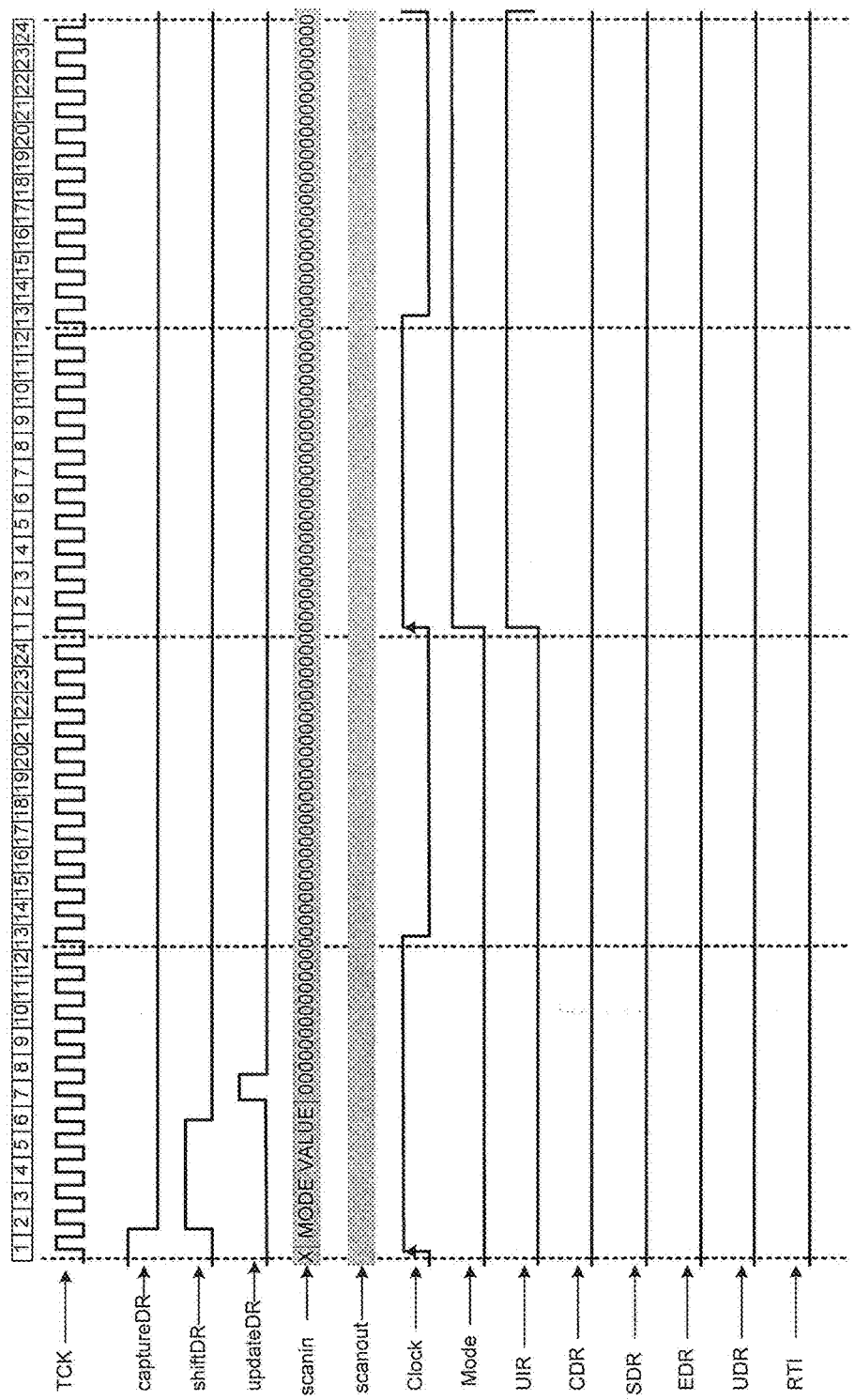
FIG. 7A is a diagram of SSI mode generation when performing sequential scan compression during system level testing of a chip, in accordance with one embodiment of the present disclosure.
Figure 7B:
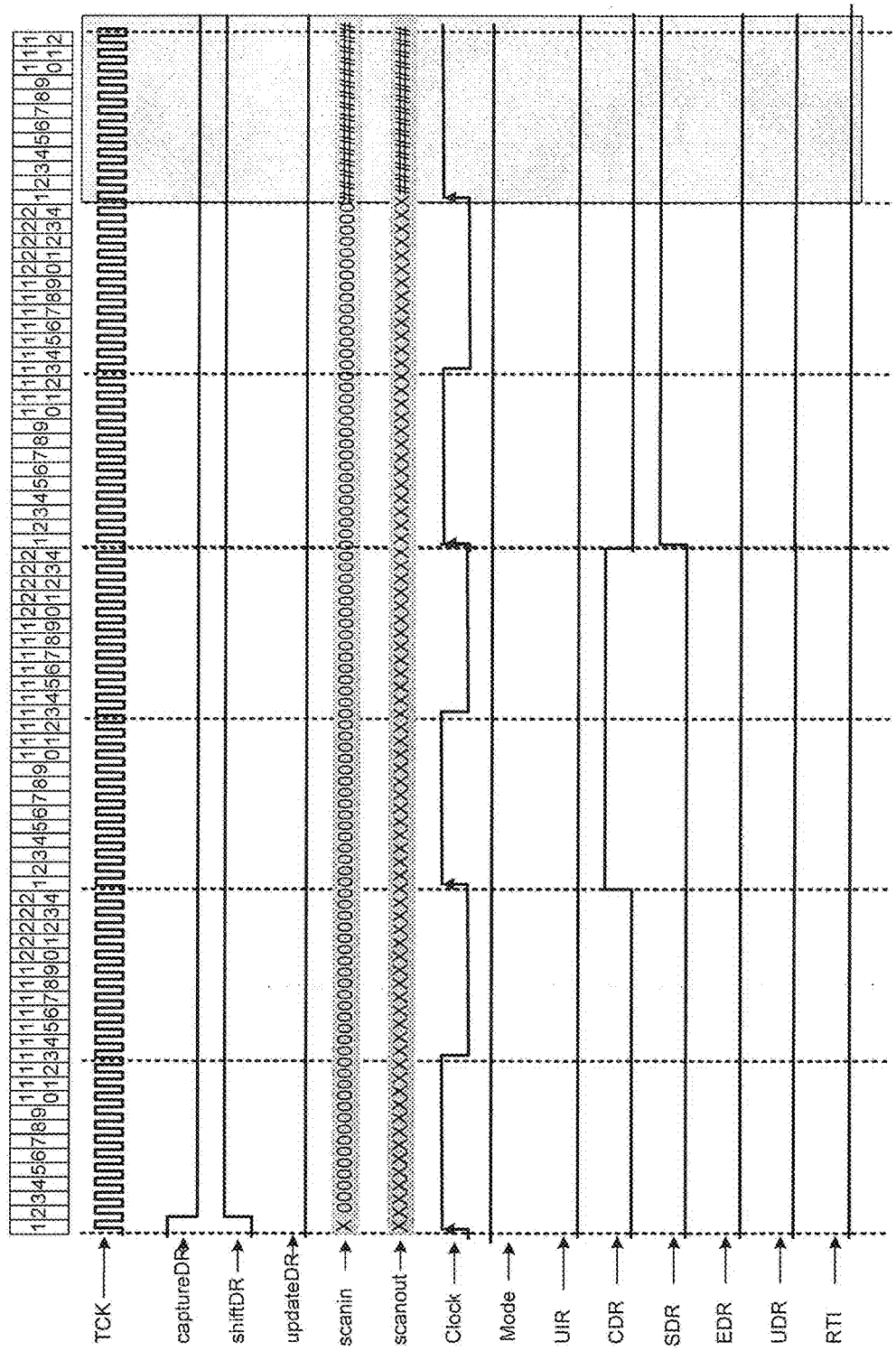
FIG. 7B is a diagram of SSI state generation when performing sequential scan compression during system level testing of a chip, in accordance with one embodiment of the present disclosure.
Figure 7C:
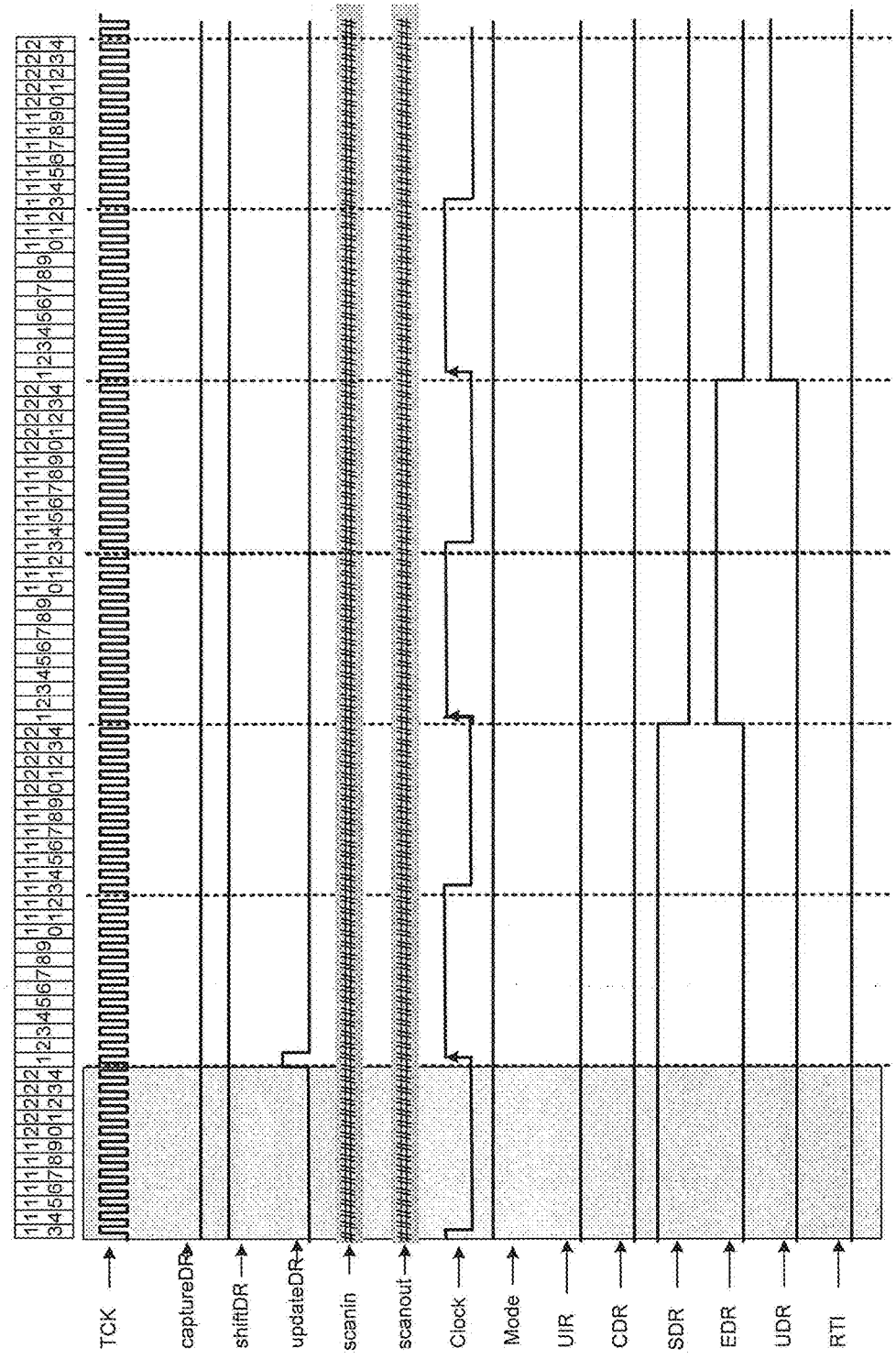
FIG. 7C is a continuation of FIG. 7B diagram of SSI state generation when performing sequential scan compression during system level testing of a chip, in accordance with one embodiment of the present disclosure.

FIG. 7A is a diagram of SSI mode generation when performing sequential scan compression during system level testing of a chip, in accordance with one embodiment of the present disclosure. FIG. 7B and FIG. 7C is a diagram of SSI state generation when performing sequential scan compression during system level testing of a chip, in accordance with one embodiment of the present disclosure.

Figure 4:
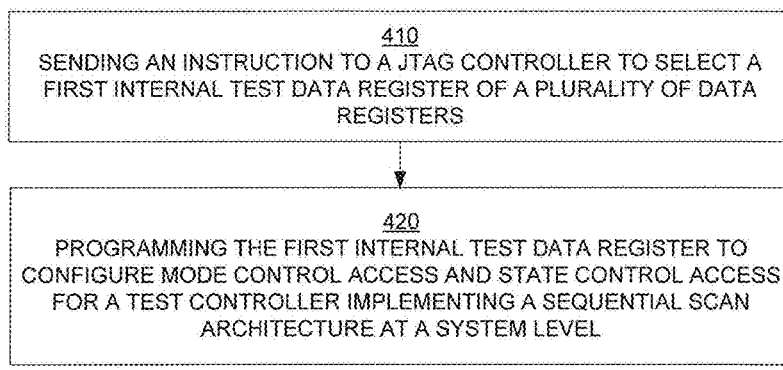
FIG. 4 is a flow diagram illustrating a method for system level testing of a chip using a system scan interface, in accordance with one embodiment of the present disclosure.

FIG. 4 is a flowchart of a computer-implemented method for the dynamic configuration of DSTA modules associated with a logic block to implement flexible bandwidth ratios for test pattern reuse of the logic block, according to embodiments of the present invention. Although specific steps are disclosed in the flowcharts, such steps are exemplary. That is, embodiments of the present invention are well-suited to performing various other steps or variations of the steps recited in the flowcharts.

Thus, according to embodiments of the present disclosure, systems and methods are described providing for implementing a scan compression architecture for online logic testing at the system level.

While the foregoing disclosure sets forth various embodiments using specific block diagrams, flowcharts, and examples, each block diagram component, flowchart step, operation, and/or component described and/or illustrated herein may be implemented, individually and/or collectively, using a wide range of hardware, software, or firmware (or any combination thereof) configurations. In addition, any disclosure of components contained within other components should be considered as examples in that many architectural variants can be implemented to achieve the same functionality.

The process parameters and sequence of steps described and/or illustrated herein are given by way of example only and can be varied as desired. For example, while the steps illustrated and/or described herein may be shown or discussed in a particular order, these steps do not necessarily need to be performed in the order illustrated or discussed. The various example methods described and/or illustrated herein may also omit one or more of the steps described or illustrated herein or include additional steps in addition to those disclosed.

While various embodiments have been described and/or illustrated herein in the context of fully functional computing systems, one or more of these example embodiments may be distributed as a program product in a variety of forms, regardless of the particular type of computer-readable media used to actually carry out the distribution. The embodiments disclosed herein may also be implemented using software modules that perform certain tasks. These software modules may include script, batch, or other executable files that may be stored on a computer-readable storage medium or in a computing system. These software modules may configure a computing system to perform one or more of the example embodiments disclosed herein. One or more of the software modules disclosed herein may be implemented in a cloud computing environment. Cloud computing environments may provide various services and applications via the internet. These cloud-based services (e.g., software as a service, platform as a service, infrastructure as a service, etc.) may be accessible through a Web browser or other remote interface. Various functions described herein may be provided through a remote desktop environment or any other cloud-based computing environment.

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the invention and its practical applications, to thereby enable others skilled in the art to best utilize the invention and various embodiments with various modifications as may be suited to the particular use contemplated.

Embodiments according to the present disclosure are thus described. While the present disclosure has been described in particular embodiments, it should be appreciated that the disclosure should not be construed as limited by such embodiments, but rather construed according to the below claims.

Additional information regarding a Ultra Fast Interface (UFI) is set forth in related co-pending application Ser. No. 15/336,716, entitled Granular Dynamic Test Systems and Methods filed on Oct. 27, 2016, which is incorporated herein by reference.

Additional information regarding DSTA is set forth in related co-pending application Ser. No. 15/336,736, entitled Dynamic Scan Test Access (DSTA) filed on Oct. 27, 2016, which is incorporated herein by reference.

Additional information regarding coordination of external pad configuration is set forth in related co-pending application Ser. No. 15/336,687, entitled Test Partition External Input/Output Interface Control filed on Oct. 27, 2016, which is incorporated herein by reference.

Additional information regarding on-line test operations and JTAG test operations is set forth in related co-pending application Ser. No. 15/336,747, entitled Scan System Interface (SSI) filed on Oct. 27, 2016, which is incorporated herein by reference.

Additional information regarding free running clock and independent test partition clock coordination is set forth in related co-pending application Ser. No. 15/336,626, entitled Dynamic Independent Test Partition Clocks filed on Oct. 27, 2016, which is incorporated herein by reference.

Additional information regarding test partition clock staggering and peak power reduction is set forth in related co-pending application Ser. No. 15/336,676, entitled Independent Test Partition Clock Coordination Across Multiple Test Partitions filed on Oct. 27, 2016, which is incorporated herein by reference.

What is claimed:
1. A computer system comprising:
a processor; and
memory coupled to said processor and having stored therein instructions that, if executed by said computer system, cause said computer system to execute a method for testing comprising:
sending an instruction to a joint test action group (JTAG) controller to select a first internal test data register of a plurality of data registers; and
programming said first internal test data register to configure mode control access and state control access for a test controller implementing a sequential scan architecture at a system level, wherein said programming said first internal test data register comprises:
programming a mode/state control bit to a second value in said first internal test data register to indicate a state control access during a state write phase;
receiving state control signals received over a JTAG scan-in interface during said state control access, and storing said state control signals in a plurality of dynamic state control registers;
receiving input data over a JTAG scan-in interface and storing said input data in a corresponding register decoded from mode values programmed in a previous mode access, wherein storing of said input data is controlled by said state control signals.

2. The method of claim 1, wherein said programming said first internal test data register comprises:
programming a mode/state control bit to a first value in said first internal test data register to indicate mode control access during a mode write phase; and
programming mode values in said first internal test data register to indicate a test mode and a corresponding register to which input data received over a JTAG scan-in interface is stored in a subsequent state control access.

3. The method of claim 1, further comprising: resetting said mode/state control bit to a first value to allow writes to said first internal test data register in a subsequent mode write phase.

4. The method of claim 1, further comprising:
disabling production automatic test equipment (ATE) testing.

5. The method of claim 1, further comprising;
generating control signals using a JTAG/IEEE 1500 interface when performing said programming of said first internal test data register.

6. The method of claim 1, further comprising:
alternating between a mode write phase and a state write phase when programming said first internal test data register that is configured receiving mode control signals and state controls signals without accessing an instruction register.

7. The method of claim 1, further comprising:
implementing a dynamic standard test access (DSTA) module to align input data received over said JTAG interface clocked at a first clock with said test controller that is clocked at a slower, second clock.

8. A method for testing, comprising:
sending a single instruction over a joint test action group (JTAG) interface to a JTAG controller to select a first internal test data register of a plurality of data registers;
programming said first internal test data register using said JTAG interface to configure mode control access and state control access for a test controller implementing a sequential scan architecture to test a chip at a system level, wherein said programming said first internal test data register comprises:
programming a mode/state control bit to a second value in said first internal test data register to indicate a state control access during a state write phase;
receiving state control signals received over a JTAG scan-in interface during said state control access, and storing said state control signals in a plurality of dynamic state control registers;
receiving input data over a JTAG scan-in interface and storing said input data in a corresponding register decoded from mode values programmed in a previous mode access, wherein storing of said input data is controlled by said state control signals.

9. The method of claim 8, wherein said programming said first internal test data register comprises:
programming a mode/state control bit to a first value in said first internal test data register to indicate mode control access during a mode write phase; and
programming mode values in said first internal test data register to indicate a test mode and a corresponding register to which input data received over a JTAG scan-in interface is stored in a subsequent state control access.

10. The method of claim 8, further comprising: resetting said mode/state control bit to a first value to allow writes to said first internal test data register in a subsequent mode write phase.

11. A device comprising:
a scan chain selectively configured to test functional components;
a scan chain test controller that controls testing of the functional components; and
an interface module that directs the scan test controller, wherein the interface module includes:
a first port configured to receive a first test control signal to program a first register that coordinates a second first type of testing state and mode information; and
a second port configured to receive a second test control signal to program a second register that coordinates a second type of testing state and mode information, wherein the first test control signal is a higher frequency than the second test control signal.

12. The device of claim 11 wherein the first type of testing is production testing and second type of testing is system testing.

13. The device of claim 12 wherein the second type of testing is on line system testing.

14. The device of claim 11 wherein the second port includes a system scan interface (SSI).

15. The device of claim 14 wherein the system scan interface (SSI) is a joint test action group (JTAG) compatible interface.

16. The device of claim 14 wherein input data is delivered to the scan chain and response data from the scan chain is observed through ports of the SSI JTAG interface.

17. The device of claim 14 wherein the second register is a IEEE 1500 wrapper data register and the system scan interface (SSI) follows an IEEE 1500 based flow.

18. The device of claim 11 wherein the first port includes an ultra fast interface (UFI).

* * * * *